(12) United States Patent
Xie et al.

(10) Patent No.: US 8,493,541 B2
(45) Date of Patent: Jul. 23, 2013

(54) ARRAY SUBSTRATE, MANUFACTURING METHOD THEREOF AND LIQUID CRYSTAL DISPLAY

(75) Inventors: Zhenyu Xie, Beijing (CN); Chunping Long, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 222 days.

(21) Appl. No.: 13/101,257

(22) Filed: May 5, 2011

(65) Prior Publication Data

US 2011/0273639 A1 Nov. 10, 2011

(30) Foreign Application Priority Data

May 6, 2010 (CN) .......................... 2010 1 0168706

(51) Int. Cl.
*G02F 1/13* (2006.01)
(52) U.S. Cl.
USPC ......................................................... 349/187
(58) Field of Classification Search
USPC ......................................................... 349/187
See application file for complete search history.

(56) References Cited

U.S. PATENT DOCUMENTS

| 7,573,538 | B2* | 8/2009 | Nomura et al. ................. 349/39 |
| 2001/0035527 | A1* | 11/2001 | Tanaka et al. ................... 257/59 |
| 2002/0018176 | A1* | 2/2002 | Kobayashi et al. ........... 349/200 |
| 2003/0197182 | A1 | 10/2003 | Kim et al. |
| 2005/0185126 | A1* | 8/2005 | Kawasaki ..................... 349/148 |
| 2005/0270434 | A1* | 12/2005 | Jung et al. ....................... 349/43 |
| 2007/0222908 | A1* | 9/2007 | Kim et al. ........................ 349/43 |
| 2009/0009677 | A1* | 1/2009 | Yamazaki et al. .............. 349/43 |
| 2009/0294781 | A1 | 12/2009 | Kim et al. |
| 2010/0157233 | A1* | 6/2010 | Ahn ............................. 349/147 |

FOREIGN PATENT DOCUMENTS

| CN | 1451996 A | 10/2003 |
| CN | 101598876 A | 12/2009 |

* cited by examiner

*Primary Examiner* — Timothy L Rude
(74) *Attorney, Agent, or Firm* — Ladas & Parry LLP

(57) ABSTRACT

A manufacturing method of an array substrate comprises forming gate lines, data lines, pixel electrodes, and gate electrodes, active layer members, source electrodes, drain electrodes of thin film transistors (TFTs) in pixel units in a display region and forming the gate lines and the data lines in a pad region. A process of forming the data lines, the active layer members, the source electrodes and the drain electrodes in the display region and simultaneously forming the data lines in the pad region is performed.

18 Claims, 5 Drawing Sheets

ARRAY SUBSTRATE, MANUFACTURING METHOD THEREOF AND LIQUID CRYSTAL DISPLAY

BACKGROUND

Embodiments of the present invention relate to an array substrate, a manufacturing method of the array substrate, and a liquid crystal display comprising the same.

Liquid crystal displays have become popular in flat panel display market. Among various types of liquid crystal displays, thin film transistor liquid crystal displays (TFT-LCDs) have been prevailing in the market. A TFT-LCD comprises an array substrate, a color filter substrate provided in parallel to and opposed to the array substrate, and a liquid crystal layer sandwiched between the array substrate and the color filter substrate. At present, the technology of TFT-LCDs tends to progress in higher resolution and lower power consumption, which brings higher requirements on the manufacturing process of a TFT-LCD. For example, data lines in a conventional TFT-LCD are formed by a composite layer of Al and Mo; however for decreasing power consumption, it is needed to replace the composite layer of Al and Mo with a material having lower resistivity such as a composite layer of Al and Nd (Al/Nd), Al, Cu or the like. Such change of the metal materials for forming date lines requires the etching method for data lines changed from a dry etching process to a wet etching process.

SUMMARY

An embodiment provides a manufacturing method of an array substrate, comprising: forming gate lines, data lines, pixel electrodes, and gate electrodes, active layer members, source electrodes, drain electrodes of thin film transistors (TFTs) in pixel units in a display region and forming the gate lines and the data lines in a pad region, wherein a process of forming the data lines, the active layer members, the source electrodes and the drain electrodes in the display region and simultaneously forming the data lines in the pad region comprises: sequentially forming an active layer film and a data line metal film; applying a photoresist layer on the data line metal film, and then exposing and developing the photoresist layer to form a first photoresist completely-remained region, a first photoresist partially-remained region and a first photoresist completely-removed region of the photoresist layer; performing a first wet etching process to etch away the data line metal film in the first photoresist completely-removed region and performing a first dry etching process to etch away the active layer film in the first photoresist completely-removed region, so that the data lines, the source electrodes and the drain electrodes are formed in the pixel units; ashing to remove the photoresist layer by a thickness of the photoresist in the first photoresist partially-remained region; performing a second wet etching process to etch away the data line metal film in the first photoresist partially-remained region and performing a second dry etching process to etch away a portion of the active layer film in the first photoresist partially-remained region, so that channel regions of the active layer members are defined in the pixel units and the data lines is formed in the pad region; ashing to remove the remaining photoresist layer; and etching away the remaining active layer film in the first photoresist partially-remained region in the pad region.

Another embodiment provides an array substrate. The array substrate comprises a display region comprising gate lines, data lines, pixel electrodes, and gate electrodes, active layer members, source electrodes, and drain electrodes of thin film transistors (TFTs) in pixel units; and a pad region comprising the gate lines and the data lines extending from the display region into the pad region, wherein in the pad region, the data lines are formed on an active layer film for forming the active layer members, and a difference between a width of the data lines and that of the underlying active layer film is smaller than a line width difference caused by two wet etching processes.

Still another embodiment provides a liquid crystal display comprising a liquid crystal panel. The liquid crystal panel comprises a color filter substrate, an array substrate and a liquid crystal layer sandwiched between the color filter substrate and the array substrate. The array substrate is manufactured by the method according to the first aspect of the invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The embodiments of the invention will become more fully understood from the detailed description given hereinafter and the accompanying drawings which are given by way of illustration only, and thus are not limitative of the embodiments of the invention and wherein.

DETAILED DESCRIPTION

Hereinafter, embodiments will be described in detail with reference to the accompanying drawings so that the objects, technical solutions and advantages of the embodiments will become more apparent. It should be noted that the embodiments described below are merely a portion of but not all of the embodiments of the invention, and thus various modifications, combinations or alterations can be made on the basis of the described embodiments without departing from the spirit and scope of the invention.

First Embodiment

An array substrate of a TFT-LCD comprises a display region comprising pixels units defined by gate lines and data lines and a pad region in the periphery of the display region. The data lines and the gate lines are extended from the display region to the pad region to connect with driver circuits. In the pad region, the gate lines are connected to a gate drive circuit, and the data lines are connected to a data drive circuit.

Figure 1:
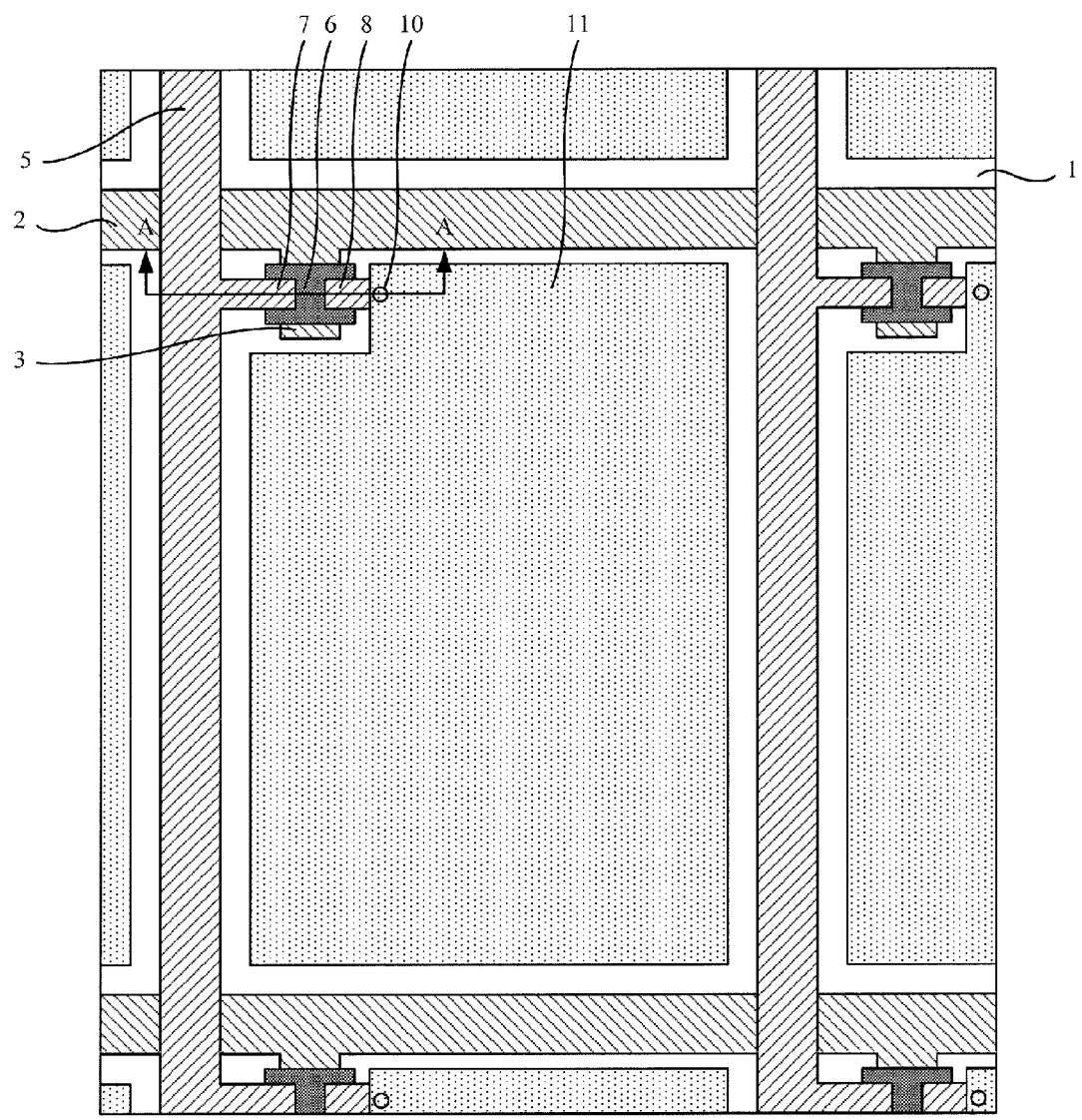
FIG. 1 is a top view showing a portion of the display region including pixel units of the array substrate obtained by the array substrate manufacturing method according to the first embodiment of the invention.
Figure 2:
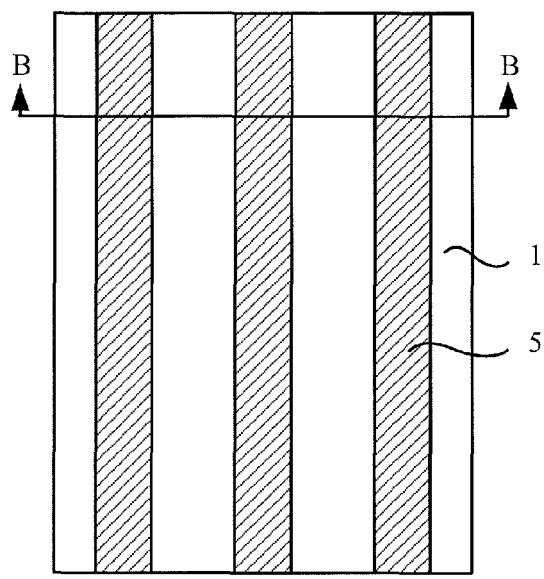
FIG. 2 is a top view showing a portion of a pad region of the array substrate obtained by the array substrate manufacturing method according to the first embodiment of the invention.

FIG. 1 is a top view showing a portion of the display region including pixel units of the array substrate obtained by the array substrate manufacturing method according to the first embodiment of the invention, FIG. 2 is a top view showing a portion of the pad region of the array substrate obtained by the array substrate manufacturing method according to the first embodiment of the invention, FIGS. 3A-3F are sectional views taken along line A-A of FIG. 1, in which the steps for forming the pixel units by the array substrate manufacturing method according to the first embodiment of the invention are shown, and FIGS. 4A-4D are sectional views taken along line B-B of FIG. 2, in which the steps for forming the pad region by the array substrate manufacturing method according to the first embodiment of the invention are shown. The array substrate manufacturing method according to the first embodiment of the invention will be described in detail below with reference to the drawings.

According to the first embodiment, the array substrate manufacturing method comprises: forming gate lines, data lines, gate electrodes of thin film transistor (TFTs), active layer members of the TFTs, source electrodes and drain electrodes of the TFTs, and pixel electrodes in pixel units in the display region and forming the gate lines and the data lines in the pad region. The data lines in the pad region are formed simultaneously with forming of the data lines, the active layer members, the source electrodes and the drain electrodes in the display region. The method according to this embodiment may be achieved by four-mask patterning process and comprise the following steps.

In step 301, a gate metal film is deposited on a base substrate 1 such as a glass or plastic substrate, and the gate metal film is etched by a patterning process with a normal (single-tone) mask plate to form the gate lines 2 and the gate electrodes 3. The gate electrodes are branched from the gate lines or a part of the gate lines. For example, the gate metal film can be formed of an opaque conductive material such as Al, Nd, Mo or the like.

In step 302, a gate insulating layer 40, an active layer film and a data line metal film 50 are sequentially formed on the base substrate 1 having the patterns formed in the step 301. The active layer film may comprise a semiconductor layer film 61 and a doped semiconductor layer film 62 which are stacked in order. For the purpose of reducing power consumption of the TFT-LCD to be manufactured, the data line metal film 50 may be formed of a low-resistivity material such as a composite layer of Al and Nd (Al/Nd), Cu or Al. The data line metal film 50 and the active layer film are etched by a patterning process with a dual-tone mask plate to form the data lines 5 and the source electrodes 7, the drain electrodes 8, and the active layer members 6 of the TFTs in the pixel units. The dual tone mask plate may be a half-tone mask plate or a gray-tone mask plate. For example, the gate insulating layer 40 and the semiconductor layer film 61 and the doped semiconductor layer film 62 of the active layer film are deposited by a plasma enhanced chemical vapor deposition (PECVD) method or the like, and the data line metal film 50 is deposited by a magnetron sputtering method or the like.

In step 303, a passivation layer film is deposited for example by a PECVD method on the base substrate 1 having the patterns formed in the steps 301-302. The passivation layer film is etched by a patterning process with a single-tone mask plate to form a passivation layer via holes 10.

In step 304, a transparent conductive film is deposited on the substrate having the patterns formed in the steps 301-303. The transparent conductive film is etched by a patterning process with a single-tone mask plate to form the pixel electrodes 11.

A portion of the display region including pixel units obtained by the above steps is shown in FIG. 1, and a portion of the pad region obtained by the above steps is shown in FIG. 2.

In this embodiment, by a second patterning process which is performed after the gate insulating layer 40 is formed, the data lines 5, the active layer members 6, the source electrodes 7 and the drain electrodes 8 are formed in the pixel units in the display region and at the same time the data lines 5 are also formed in the pad region. Referring to FIGS. 3A to 3F and FIGS. 4A to 4D, the second patterning process in the pad region will be described in detail as follows.

Figure 3A:
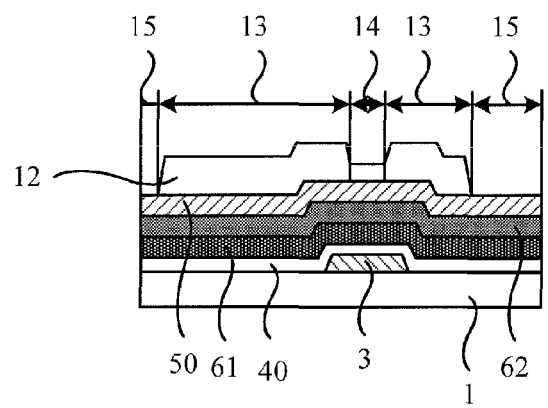
FIG. 3A-3F is a sectional view taken along line A-A of FIG. 1, in which the steps for forming the pixel units by the array substrate manufacturing method according to the first embodiment of the invention are shown.
Figure 4A:
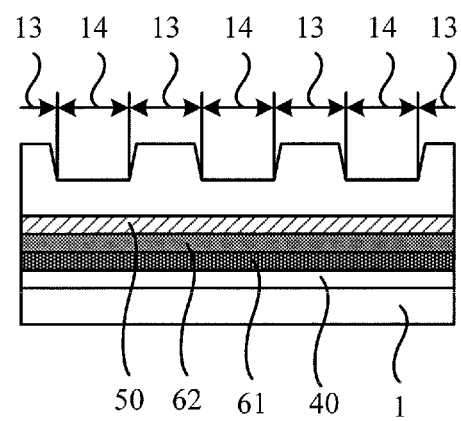
FIG. 4A-4D is a sectional view taken along line B-B of FIG. 2, in which the steps for forming the pad region by the array substrate manufacturing method according to the first embodiment of the invention are shown.
Figure 4B:
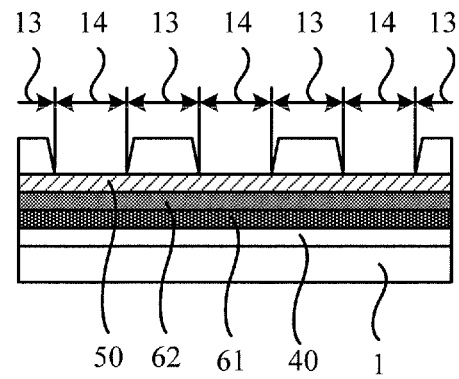

In step 401, the active layer film and the data line metal film 50 are sequentially deposited on the gate insulating film 40, as shown in FIGS. 3A and 4A. As described above, the active layer film for example comprises the semiconductor layer film 61 and the doped semiconductor layer film 62, which are stacked in order. In addition, as described above, for the purpose of decreasing power consumption of the TFT-LCD to be manufactured, the data line metal film 50 may be formed by a low-resistivity material such as a composite layer of Al and Nd (Al/Nd), Cu or Al.

In step 402, a photoresist layer 12 is applied on the surface of the data line metal film 50, and then the photoresist layer 12 is exposed and developed with a dual-tone mask plate to form a first photoresist completely-remained region 13, a first photoresist partially-remained region 14 and a first photoresist completely-removed region 15 of the photoresist layer. As shown in FIG. 3A, in the display region, the first photoresist completely-remained region 13 corresponds to the region where the source electrode and the drain electrode of the TFT in each pixel unit to be formed, and the first photoresist partially-remained region 14 corresponds to the region where the channel region of the active layer members is to be formed. As shown in FIG. 4A, in the pad region, only the first photoresist completely-remained region 13 and the first photoresist partially-remained region 14 are formed, whereas the first photoresist completely-removed region 15 is not formed. In addition, as shown in FIG. 4A, in the pad region, the first photoresist completely-remained region 13 corresponds to the regions where the data lines are to be formed, and the first photoresist partially-remained region 14 corresponds to the regions between the data lines to be formed.

Figure 3B:
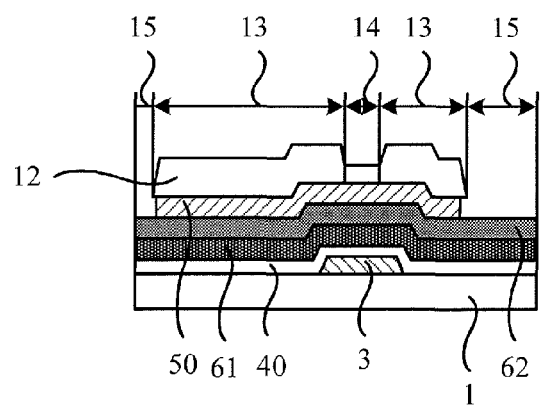
Figure 3C:
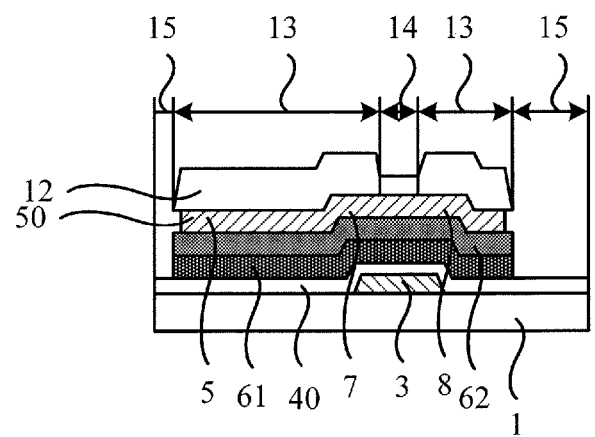

In step 403, a first wet etching process is performed to etch away the data line metal film 50 in the first photoresist completely-removed region 15 and then a first dry etching process is performed to etch away the active layer film exposed in the first photoresist completely-removed region 15, and thus the data lines 5, the source electrodes 7 and the drain electrodes 8 are formed in the pixel units, and the active layer film is formed into a shape of peninsula under the source and drain electrodes 7 and 8, as shown in FIGS. 3B and 3C. It should be noted that, the data lines 5 in the display region are merely shown in FIG. 1, but not in FIGS. 3A-3F. In this step 403, since the first photoresist completely-removed region 15 is not formed in the pad region as described in the step 402, the pad region is protected by the photoresist layer and the configuration thereof is not changed in the step 403.

Figure 3D:
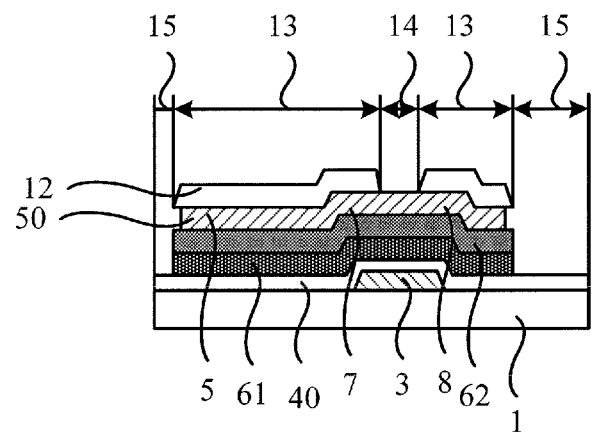

In step 404, the photoresist layer is ashed and removed by the thickness of photoresist layer in the first photoresist partially-remained region 14, so that the photoresist layer in the first photoresist partially-remained region 14 is completely removed and the photoresist layer in the first photoresist completely-remained region 13 is remained with a decreased thickness. After this step, the photoresist layer in the display region is shown in FIG. 3D, and the photoresist layer in the pad region in shown in FIG. 4B.

Figure 3E:
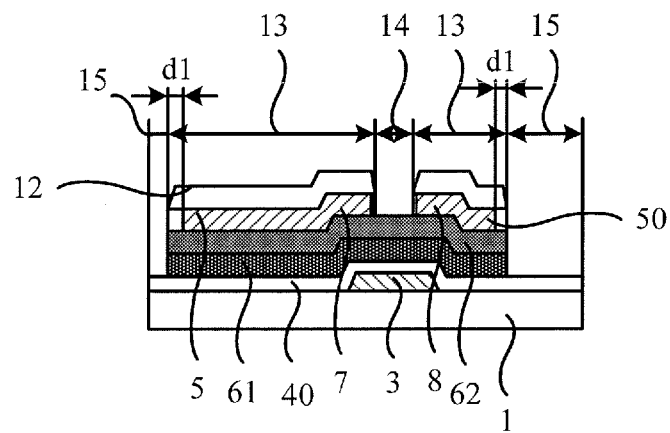
Figure 3F:
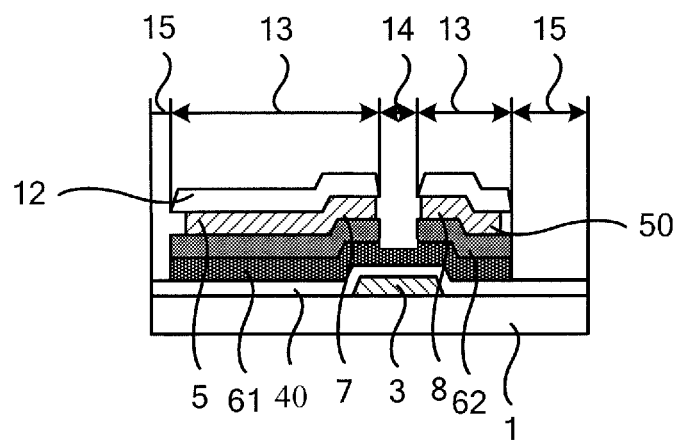
Figure 4C:
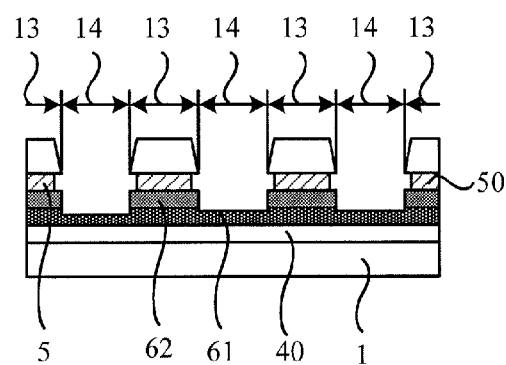

In step 405, a second wet etching process is performed to etch away the data line metal film 50 exposed in the first photoresist partially-remained region 14 and then a second dry etching process is performed to etch away a portion of the active layer film exposed in the first photoresist partially-remained region 14, and thus the channel regions of the active layer members 6 are defined in the pixel units, and the data lines 5 are formed in the pad region, as shown in FIGS. 3E and 3F, and FIG. 4C. At this time, a TFT channel region is provided in each active layer member 6 between the source electrode 7 and the drain electrode 8. In this step, the etching of the active layer film in the pad region is conducted simultaneously with the etching of the active layer film in the display region. In the display region, in the channel region, the doped semiconductor film 62 is etched away, and a portion of the semiconductor film 61 is also etched in the thickness direction.

In step 406, the remaining photoresist layer is ashed and removed.

Figure 4D:
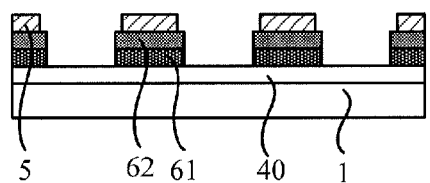

In step 407, in the pad region, the remaining active layer film in the first photoresist partially-remained region 14 is etched away, as shown in FIG. 4D. After the formation of the data lines 5 in the pad region, if the remaining active layer film exposed between the data lines in the pad region is not removed, a leakage current may occur between adjacent data lines 5 and the data lines 5 may be electrically connected with each other. Therefore, the remaining active layer film between the data lines 5 in the pad region is required to be removed. For example, the remaining active layer film between the data lines 5 in the pad region may be removed by a separate etching process with a normal mask plate. Here, the second patterning process according to the first embodiment of the invention is completed.

As shown in FIG. 3E, in the display region, the data lines, the source electrodes and the drain electrodes that have undergone the first wet etching process are over-etched by the second wet etching process, and thus a line width difference is formed between the data line and the photoresist pattern remaining thereon. As shown in FIG. 3E, a distance of "d1" is indicated to show a line width difference on either side, thus the line width difference for one data line is equal to the line width of the photoresist pattern minus the line width of the final data line, that is, 2×d1 which is about 4 µm. After the second wet etching process and the second dry etching process, the active layer film formed of a non-metal material is seldom over-etched and the line width difference between the active layer member and the photoresist pattern remained thereon is relatively small; therefore, a width difference also occurs between the data line and the underlying active layer and is about 3~4 µm. In addition, in the display region, as shown in FIG. 1, the pixel electrode of each pixel unit is provided between the adjacent data lines, the data lines are formed with a relatively low density, and thus a relatively large line width difference for the data line is allowable.

However, in the pad region, a relatively large line width difference for the data line is not desirable for the reasons described below.

In the pad region, for connecting with the driver circuits, it is required to arrange the data lines and the gate lines with a large density, thus the data lines and the gate lines in the pad region is arranged with an even larger density in the case of a high-resolution, small-size liquid crystal display. However, the high density arrangement of the data lines is adversely influenced by the line with difference for the following reasons. In order to achieve a relatively low resistance, the width of the data lines cannot be formed too small, that is, there is a lower limit for the width of the data lines. When the lower limit for the width of the data lines is specified, the high density arrangement of the data lines can be achieved only by reducing the distance between adjacent data lines. Due to the line width difference, the smallest distance between adjacent data lines at least equals to the sum of the line width difference and the smallest allowable distance of the photoresist patterns, wherein the smallest allowable distance of the photoresist patterns is determined by the exposing process and the like. For example, if the line width difference is 4 µm and the smallest allowable distance of the photoresist patterns is 5 µm, the smallest distance between adjacent data lines become at least 9 µm. Therefore, if a relatively large line width difference occurs in the pad region, the distance between adjacent data lines is increased and thus it is difficult to achieve a higher density arrangement of the data lines in the pad region.

According to the first embodiment, during forming the data lines in the pad region, the data lines in the pad region only undergo one wet etching process because the completely-removed region of the photoresist is not formed in the pad region as described in the above step 402, and thus a relatively large line width difference caused by two wet etching process can be avoided. That is, by the method according to the first embodiment, even when the material which requires a wet etching process (such as the material with a low resistivity) is used to form the data lines, a relatively low line width difference for the data lines can be achieved in the pad region. Since the line width difference for the data lines is decreased, the distance between adjacent data lines can be decreased and a higher density arrangement of the data lines can be achieved in the pad region. This is more advantageous for the pad region of a high resolution, small-size liquid crystal display. In addition, according to this embodiment, a relatively small distance between adjacent data lines in the pad region can be achieved in a simple and efficient manner.

In addition, it should be noted that, the process for forming the data lines in the pad region according to the first embodiment is not limited to the four-mask patterning process, but can be applied to other array substrate manufacturing methods. It is also within the scope of the invention as long as the process for forming the data lines, the source electrodes, the drain electrodes and the active layer members according to this embodiment is employed.

Second Embodiment

In the first embodiment, a separate etching process is employed to etch away the remaining active layer film in the first photoresist partially-remained region in the pad region. However, the remaining active layer film between the data lines in the pad region may be etched when the passivation layer is etched to form the via holes therein in the display region as described below.

Figure 5:
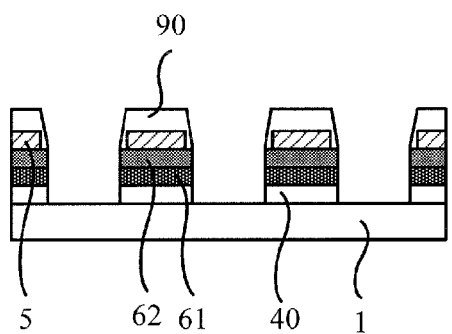
FIG. 5 is a sectional view showing a pad region obtained by an array substrate manufacturing method according to a second embodiment of the invention.

After the above step 406, the passivation layer is firstly formed in the display region and the pad region on the substrate. Then, a patterning process is performed with a single-tone mask plate so that the passivation layer above the drain electrode is etched away to form the passivation layer via holes, and the passivation layer and the remaining active layer film in the first photoresist partially-remained region (or between the data lines) in the pad region are simultaneously etched away. Depending on the etching time in the patterning process, a portion of or the entirety of the gate insulating film 40 in the first photoresist partially-remained region in the pad region may be etched away, as shown in FIG. 5.

According to this embodiment, the remaining active layer film between the data lines 5 in the pad region can be removed with the patterning process for forming the passivation layer via holes in the display region. Therefore, the manufacture complexity is not increased and the production efficiency can be improved.

Third Embodiment

In the second embodiment, a patterning process is performed with a single-tone mask plate so that the passivation layer above the drain electrode of the TFT in each pixel unit is etched away to form the corresponding passivation layer via hole, and the passivation layer and the remaining active layer film in the first photoresist partially-remained region in the pad region are simultaneously etched away. However, such patterning process may be performed with a dual-tone mask plate as described below.

In step 801, the passivation layer 90 is formed on the substrate after the above step 406 in the first embodiment.

In step 802, a photoresist layer is applied on the passivation layer 90, and then the photoresist layer is exposed with a dual tone mask plate or a half tone mask plate and developed to form a second photoresist completely-remained region, a second photoresist partially-remained region and a second photoresist completely-removed region of the photoresist layer. The second photoresist completely-removed region of the developed photoresist layer corresponds to regions, in the display region, where the passivation layer via holes are to be formed; the second photoresist partially-remained region corresponds to region, in the pad region, which is between the adjacent data lines (that is, a region corresponding to the first photoresist partially-remained region); and the second photoresist completely-remained region of the developed photoresist layer corresponds to the other portions.

In step 803, a first etching process is performed to etch away the passivation layer over the drain electrodes to form the passivation layer via holes.

In step 804, the photoresist layer is ashed and removed by the thickness of the photoresist in the second photoresist partially-remained region, and the second photoresist completely-remained region is still covered by the remaining photoresist.

Figure 6:
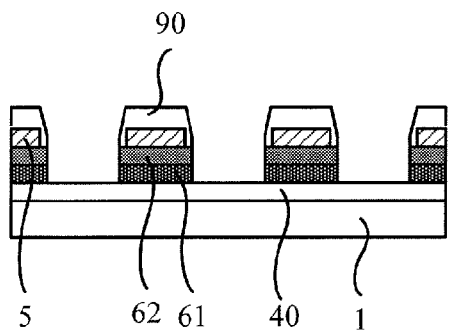
FIG. 6 is a sectional view showing a pad region formed by an array substrate manufacturing method according to a third embodiment of the invention.

In step 805, a second etching process is performed to etch away the passivation layer 90 and the remaining active layer film between the data lines in the pad region in the second photoresist partially-remained region, as shown in FIG. 6.

According to this embodiment, the passivation layer and the remaining active layer between the data lines in the pad region is etched away in a separate etching process from that for forming the passivation layer via hole. Therefore, the etching time of etching away the passivation layer and the remaining active layer film between the data lines in the pad region can be controlled, and thus a portion or the entirety of the gate insulating layer in the second photoresist partially-remained region in the pad region can be remained, and the step height of the gate insulating layer can be decreased.

Alternatively, in step 802, when the photoresist layer is patterned with a dual-tone mask plate, the second photoresist completely-removed region of the photoresist layer corresponds to the region corresponding to the first photoresist partially-remained region in the pad region (that is, the region between adjacent data lines in the pad region), the second photoresist partially-remained region corresponds to the region in the display region where the passivation layer via holes are to be formed, and the second photoresist completely-remained region corresponds to other portions. Then, in the pad region, the exposed film in the second photoresist completely-removed region is partially etched by a first etching process. Next, the photoresist layer is ashed and removed by the thickness of the photoresist in the second photoresist partially-remained region. Then, a second etching process is performed, so that the passivation layer above the drain electrode is etched away to form the passivation layer via holes, and the remaining portion of the passivation layer and the active layer film in the second photoresist completely-removed region in the interface are etched away as well.

According to the third embodiment, the film exposed in the pad region is partially removed firstly; then the photoresist is ashed to expose the region where the passivation layer via holes are to be formed; and finally the exposed regions in both the display region and the pad region are simultaneously etched by the second etching process. The stacked layer of the passivation layer and remaining active layer film, exposed in the pad region, undergoes two etching processes, whereas the passivation layer in the display region undergoes one etching process only. Therefore, by appropriately controlling the etching time of the two etching processes, the passivation layer at the passivation layer via holes can be completely etched, and at the same time, the passivation layer and the remaining active layer film between data lines in the pad region can be completely etched as well with a portion of or the entirety of the gate insulating layer remaining in the pad region.

According to the first to third embodiments of the invention, the array substrate can be manufactured in a simple and efficient manner, and the high density arrangement of data lines can be achieved in the pad region. In particular, the distance between adjacent data lines in the pad region can be decreased to about 5 μm. In addition, the embodiments described above are especially useful for the case where the data lines are formed of low-resistivity material which requires a wet etching process, such as a composite layer of Al and Nd, Al or Cu.

Fourth Embodiment

According to a fourth embodiment of the invention, an array substrate is provided. The array substrate comprises a base substrate 1, and a display region and a pad region are defined on the substrate 1. Gate lines 2, data lines 5, pixel electrodes 11, and gate electrodes 3, active layer members 6, source electrodes 7 and drain electrodes 8 of TFTs are formed in the display region. The gate lines 2 and the data lines 5 extend to in the pad region. In the pad region, the date lines 5 are formed on the active layer film for forming the active layers, and the difference between the width of the data lines 5 and that of the remaining active layer film is smaller than the line width difference caused by two wet etching processes, as shown in FIG. 4D.

The array substrate according to this embodiment can be manufactured by the array substrate manufacturing method according to the above embodiments of the invention, the active layers, the data lines, the source electrodes and the drain electrodes can be formed by one patterning process with a dual-tone mask plate, and thus the high density arrangement of data lines in the pad region can be achieved in a simple and efficiency manner and the manufacture cost can be decreased.

According to this embodiment, in the pad region, the pattern of the gate insulating layer 4 left between the data lines 5 and the gate lines 2 corresponds to that of the data lines 5, as shown in FIGS. 5 and 6.

According to this embodiment, the distance between adjacent data lines in the pad region is smaller than 9 μm, and preferably, about 5 μm. For example, the data lines can be formed of a low-resistivity material such as a composite layer of Al and Nd, Al or Cu.

Fifth Embodiment

According a fifth embodiment of the invention, a liquid crystal display comprising a liquid crystal panel is provided. The liquid crystal panel comprises a color filter substrate and an array substrate manufactured by the method according to the above embodiments of the invention. A liquid crystal layer is filled between the color filter substrate and the array substrate. According to this embodiment, the liquid crystal display has the advantages of low manufacture cost and high density arrangement of data lines in the pad region.

It should be appreciated that the embodiments described above are intended to illustrate but not limit the present invention. Although the present invention has been described in detail herein with reference to the preferred embodiments, it should be understood by those skilled in the art that the present invention can be modified and some of the technical features can be equivalently substituted without departing from the spirit and scope of the present invention.

What is claimed is:

1. A manufacturing method of an array substrate, comprising:

forming gate lines, data lines, pixel electrodes, and gate electrodes, active layer members, source electrodes, drain electrodes of thin film transistors (TFTs) in pixel units in a display region and farming the gate lines and the data lines in a pad region, wherein a process of forming the data lines, the active layer members, the source electrodes and the drain electrodes in the display region and simultaneously forming the data lines in the pad region comprises:

sequentially forming an active layer film and a data line metal film;

applying a photoresist layer on the data line metal film, and then exposing and developing the photoresist layer to form a first photoresist completely-remained region, a first photoresist partially-remained region and a first photoresist completely-removed region of the photoresist layer;

performing a first wet etching process to etch away the data line metal film in the first photoresist completely-removed region and performing a first dry etching process to etch away the active layer film in the first photoresist completely-removed region, so that the data lines, the source electrodes and the drain electrodes are formed in the pixel units;

ashing to remove the photoresist layer by a thickness of the photoresist in the first photoresist partially-remained region;

performing a second wet etching process to etch away the data line metal film in the first photoresist partially-remained region and performing a second dry etching process to etch away a portion of the active layer film in the first photoresist partially-remained region, so that channel regions of the active layer members are defined in the pixel units and the data lines is formed in the pad region;

ashing to remove the remaining photoresist layer; and etching away the remaining active layer film in the first photoresist partially-remained region in the pad region.

2. The method according to claim 1, wherein the process of etching away the remaining active layer film in the first photoresist partially-remained region in the pad region comprises:

forming a passivation layer in the display region and the pad region; and performing a patterning process with a single-tone mask plate, so that the passivation layer above the drain electrodes is etched away to form passivation layer via holes, and the passivation layer and the remaining active layer film in the first photoresist partially-remained region in the pad region are simultaneously etched away.

3. The method according to claim 1, wherein the process of etching away the remaining active layer film in the first photoresist partially-remained region in the pad region comprises:

forming a passivation layer in the display region and the pad region; and performing a patterning process with a dual-tone or half-tone mask plate, so that the passivation layer above the drain electrode is etched away by a first etching process to form passivation layer via holes, and the passivation layer and the remaining active layer film in the first photoresist partially-remained region in the pad region are etched away by a second etching process.

4. The method according to claim 1, wherein the process of etching away the remaining active layer film in the first photoresist partially-remained region in the pad region comprises:

forming a passivation layer in the display region and the pad region; and performing a patterning process with a dual-tone or half-tone mask plate, so that a portion of films in the first photoresist partially-remained region in the pad region is etched away by a first etching process, the passivation layer above the drain electrode is etched away by a second etching process to form passivation layer via holes, and the remaining passivation layer and the remaining active layer film in the first photoresist partially-remained region in the pad region is simultaneously etched away by the second etching process.

5. The method according to claim 1, wherein the data lines are formed of a low-resistivity material.

6. The method according to claim 5, wherein the low-resistivity material comprises a composite layer of Al and Nd, Al or Cu.

7. The method according to claim 1, wherein a distance between the data lines in the pad region is smaller than 9 μm.

8. The method according to claim 7, wherein the distance between the data lines in the pad region is 5 μm.

9. The method according to claim 1, wherein the active layer film is formed by a plasma enhanced chemical vapor deposition method.

10. The method according to claim 1, wherein the data line metal film is formed by a magnetron sputtering method.

11. The method according to claim 1, wherein in the pad region, a gate insulating layer is further formed between the gate lines and the data lines, and a pattern of the gate insulating layer corresponds to that of the data lines.

12. An array substrate, comprising:
a display region comprising gate lines, data lines, pixel electrodes, and gate electrodes, active layer members, source electrodes, and drain electrodes of thin film transistors (TFTs) in pixel units; and
a pad region comprising the gate lines and the data lines extending from the display region into the pad region,
wherein in the pad region, the data lines are formed on an active layer film for forming the active layer members, and a difference between a width of the data lines and that of the underlying active layer film is smaller than a line width difference caused by two wet etching processes.

13. The array substrate according to claim 12, wherein in the pad region, a gate insulating layer is further formed between the gate lines and the data lines, and a pattern of the gate insulating layer corresponds to that of the data lines.

14. The array substrate according to claim 12, wherein a distance between the data lines in the pad region is smaller than 9 μm.

15. The array substrate according to claim 14, wherein the distance between the data lines in the pad region is 5 μm.

16. The array substrate according to claim 12, wherein the data lines are formed of a low-resistivity material.

17. The array substrate according to claim 16, wherein the low-resistivity material comprises a composite layer of Al and Nd, Al or Cu.

18. A liquid crystal display comprising a liquid crystal panel, wherein the liquid crystal panel comprises:
a color filter substrate,
an array substrate according to claim 12, and
a liquid crystal layer sandwiched between the color filter substrate and the array substrate.

* * * * *